United States Patent
Owechko et al.

(10) Patent No.: US 9,230,302 B1
(45) Date of Patent: Jan. 5, 2016

(54) FOVEATED COMPRESSIVE SENSING SYSTEM

(71) Applicant: HRL Laboratories, LLC, Malibu, CA (US)

(72) Inventors: Yuri Owechko, Newbury Park, CA (US); Kang-Yu Ni, Calabasas, CA (US); Shankar R. Rao, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 109 days.

(21) Appl. No.: 14/204,028

(22) Filed: Mar. 11, 2014

Related U.S. Application Data

(60) Provisional application No. 61/780,716, filed on Mar. 13, 2013.

(51) Int. Cl.
*G06K 9/32* (2006.01)
*G06T 3/40* (2006.01)
*G06T 7/00* (2006.01)

(52) U.S. Cl.
CPC ............ *G06T 3/4053* (2013.01); *G06T 7/0022* (2013.01); *G06T 2207/10004* (2013.01); *G06T 2207/20021* (2013.01)

(58) Field of Classification Search
None
See application file for complete search history.

(56) References Cited

U.S. PATENT DOCUMENTS

| | | | |
|---|---|---|---|
| 2006/0038705 A1* | 2/2006 | Brady | G06T 9/00 341/123 |
| 2011/0279682 A1* | 11/2011 | Li | G01S 3/786 348/169 |
| 2014/0247372 A1* | 9/2014 | Byren | H04N 5/23296 348/222.1 |

OTHER PUBLICATIONS

Lihi Zelnik-Manor, Kevin Rosenblum, Yonina C. Eldar and, Sensing Matrix Optimization for Block-Sparse Decoding. IEEE Transactions on Signal Processing 59(9): 4300-4312 (2011).

M. Aharon, M. Elad, and A.M. Bruckstein, "The K-SVD: An Algorithm for Designing of Overcomplete Dictionaries for Sparse Representation", the IEEE Trans. on Signal Processing, vol. 54, No. 11, pp. 4311-4322, Nov. 2006.

Ronald Larcom and Thayne R. Coffman, "Foveated Image Formation through Compressive Sensing," Image Analysis & Interpretation (SSIAI), 2010 IEEE Southwest Symposium, May 23-25, 2010, Austin, TX, USA, pp. 145-148.

Samir D. Sharma and Krishna S. Nayak, "Region of Interest Compressed Sensing," ISMRM Workshop on Data Sampling and Image Reconstruction, Jan. 2009, Sedona.

* cited by examiner

*Primary Examiner* — Phuoc Tran
(74) *Attorney, Agent, or Firm* — Tope-McKay & Associates

(57) ABSTRACT

Described is a system for foveated compressive sensing. The system is configured to receive an input image f of a scene and initialize a measurement matrix. Global measurements are then performed, with a lower resolution image of the scene thereafter reconstructed. Task salient regions are extracted from the low resolution image. Thereafter, the system estimates a task-specific operator and detects regions-of-interest (ROI) based on the task salient regions. An ROI-adapted and foveated measurement matrix is then generated. Local measurements are then performed on task-relevant ROIs. A higher resolution image can then be reconstructed of the scene to allow for identification of objects in the ROI.

12 Claims, 7 Drawing Sheets

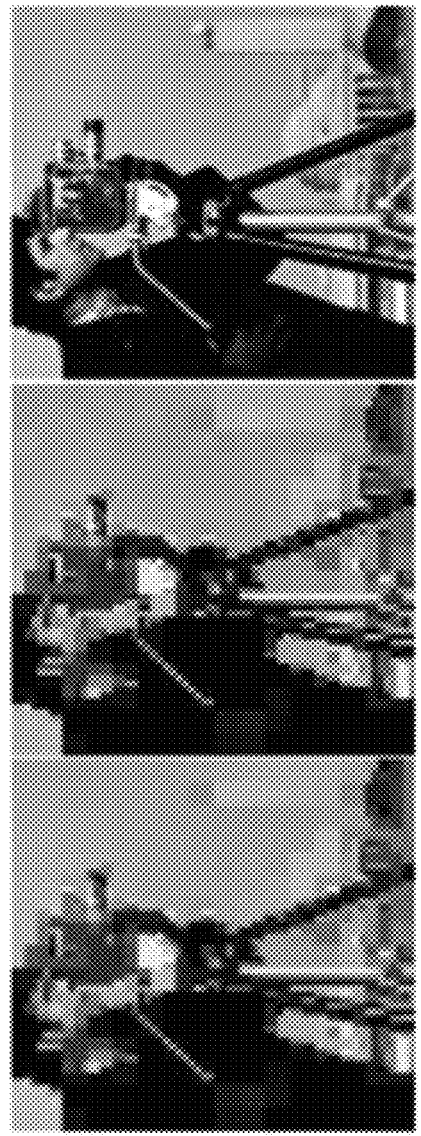
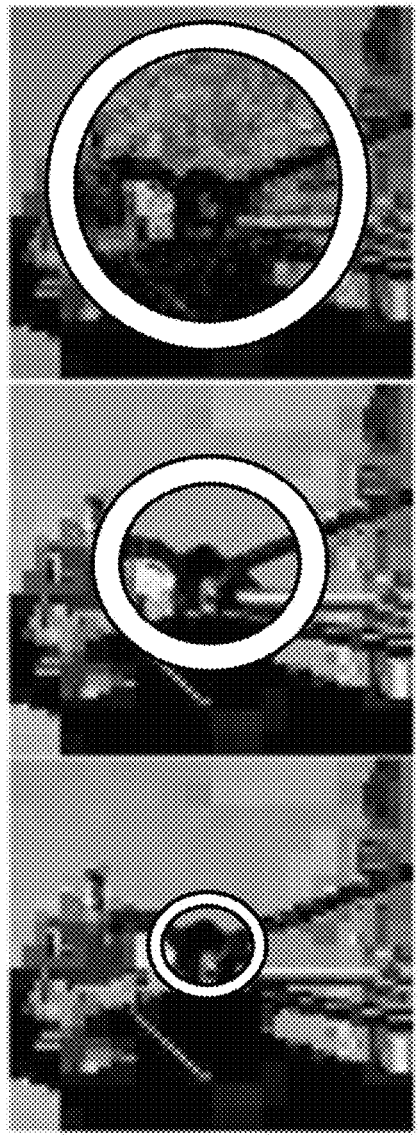

FOVEATED COMPRESSIVE SENSING SYSTEM

GOVERNMENT RIGHTS

This invention was made with government support under U.S. Government Contract Number N66001-11-C-4001 Context and Task Aware Knowledge Enhanced Compressive Imaging. The government has certain rights in the invention.

CROSS-REFERENCE TO RELATED APPLICATIONS

This is a non-provisional patent application of U.S. Provisional Application No. 61/780,716, filed on Mar. 13, 2013, and entitled, "Foveated Compressive Sensing System,"

FIELD OF INVENTION

The present invention relates to sensing system and, more particularly, to a sensing system that utilizes foveated compressive sensing.

BACKGROUND OF INVENTION

Surveillance and other monitoring systems are typically dependent on the limitations of the applicable imaging system. The effective spatial and temporal resolution of current imaging systems is limited not only by the sensor pixel count, but also by onboard size, weight and power (SWAP) constraints and by communication bandwidth limitations.

Current imaging systems perform Nyquist sampling of optical images using sensor arrays in which each detector element records a single pixel in the image, which is digitized and stored in an array of pixel values (which can then be compressed). Conventional sampling is not adaptive to the task to be performed and is inefficient in hardware and computational resource utilization because it stores information that is not necessarily needed for a particular task. In addition, image resolution is limited by the physical number of detector elements, resulting in ever larger sensor arrays and SWAP/bandwidth requirements as mission requirements increase. Compressive Measurement or sensing (CM) is a potentially viable alternative to Nyquist sampling with a sound theoretical basis. It is based on the fact that images have sparse representations for certain sets of basis functions or dictionaries. CM has been used to reconstruct images using far fewer measurements than predicted by the Nyquist sampling criterion by preprocessing with random measurement matrices and using sparsity-enforcing optimization methods to reconstruct the image. Existing CM imaging systems, however, do not take advantage of prior knowledge about the data or the task to be performed with the imagery or real-time adaptation to the data, which limits the amount of SWAP and bandwidth reduction that can be achieved.

Thus, a continuing need exists for an image sensing system that incorporates task-aware sampling to greatly reduce the number of physical measurements needed to achieve a given level of task performance, thereby greatly increasing the utility of the sensing system while reducing SWAP and communication bandwidth requirements

SUMMARY OF INVENTION

Described is a system, method, and computer program product for foveated compressive sensing. The system, for example, includes one or more processors and a memory. The memory is a non-transitory computer-readable medium having executable instructions encoded thereon, such that upon execution of the instructions, the one or more processors performs several operations, such as receiving an input image f of a scene; initializing a measurement matrix; performing global measurements of the input image f; reconstructing a lower resolution image of the scene; extracting task salient regions from the low resolution image; estimating a task-specific operator and detecting regions-of-interest (RO) based on the task salient regions; generating an ROI-adapted and foveated measurement matrix; performing local measurements on task-relevant ROIs; and reconstructing a higher resolution image of the scene to allow for identification of objects in the ROI.

In another aspect, initializing the measurement matrix further includes operations of defining a first task; implementing a task prior; and initializing the measurement matrix.

Further, in initializing a measurement matrix, the input image f is focused on a spatial light modulator (SLM) that processes image patches in parallel and generates rows of a foveated measurement matrix $AP_f$ serially.

In yet another aspect, at each time step j, a product of the input image f and row j of $AP_f$ is focused on a detector array having a plurality of detectors, such that each detector in the detector array performs a separate patch measurement by spatially integrating $AP_f f$ in its local patch area.

Finally and as noted above, the present invention also includes a computer program product and a computer implemented method. The computer program product includes computer-readable instructions stored on a non-transitory computer-readable medium that are executable by a computer having one or more processors, such that upon execution of the instructions, the one or more processors perform the operations listed herein. Alternatively, the computer implemented method includes an act of causing a computer to execute such instructions and perform the resulting operations.

BRIEF DESCRIPTION OF THE DRAWINGS

The objects, features and advantages of the present invention will be apparent from the following detailed descriptions of the various aspects of the invention in conjunction with reference to the following drawings, where:

FIG. 7A is a lower resolution image;

FIG. 7B is an illustration depicting background reconstruction from 50% measurements of the lower resolution image as depicted in FIG. 7A;

FIG. 7C is a higher resolution image compared to that of FIG. 7A;

FIG. 7D is an illustration depicting the ROI as reconstructed from 12.5% of measurements of the higher resolution image, where the ROI radius is 16 pixels;

FIG. 7E is an illustration depicting the ROI as reconstructed from 12.5% of measurements of the higher resolution image, where the ROI radius is 32 pixels; and FIG. 7F is an illustration depicting the ROI as reconstructed from 12.5% of measurements of the higher resolution image, where the ROI radius is 48 pixels.

DETAILED DESCRIPTION

Figure 1:
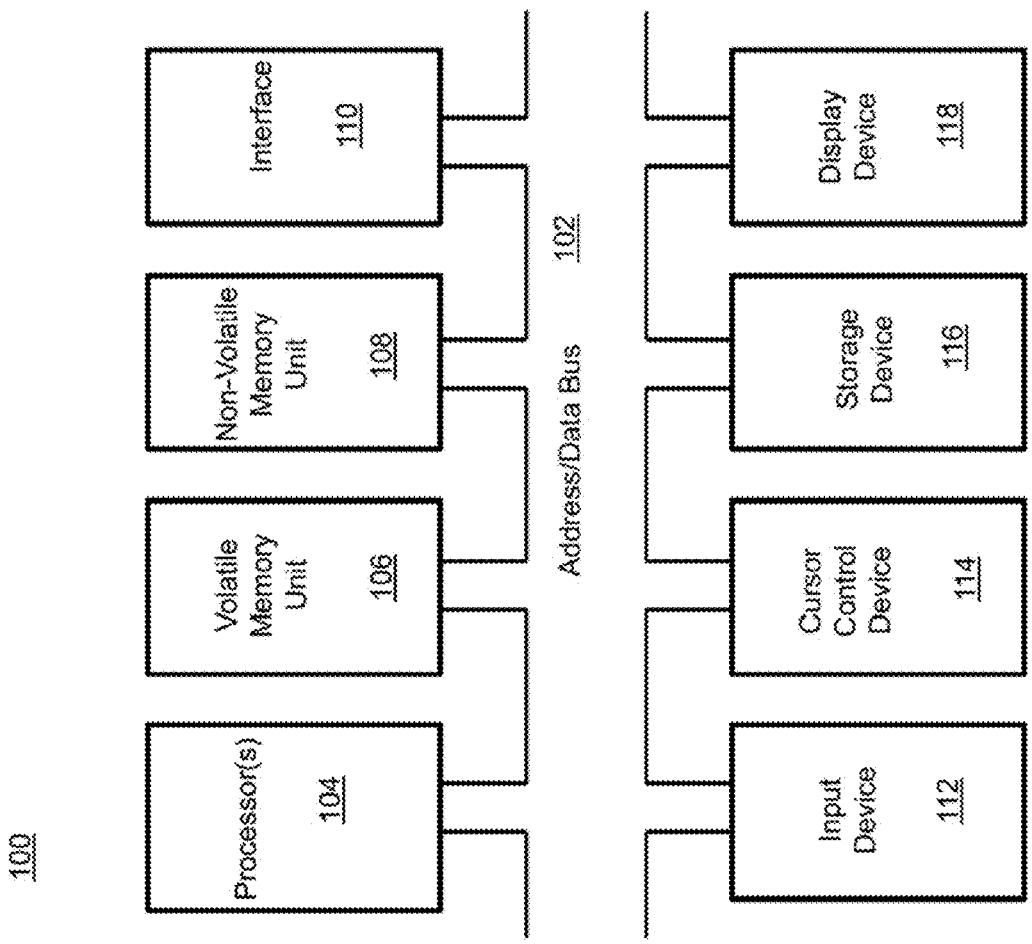
FIG. 1 is a block diagram depicting the components of foveated compressive sensing system according to the principles of the present invention.

The present invention relates to sensing system and, more particularly, to a sensing system that utilizes foveated compressive sensing. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of aspects. Thus, the present invention is not intended to be limited to the aspects presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a description of the various principal aspects of the present invention is provided. Subsequently, an introduction provides the reader with a general understanding of the present invention. Finally, specific details of the present invention are provided to give an understanding of the specific aspects.

(1) Principal Aspects

The present invention has three "principal" aspects. The first is a foveated compressive sensing system. The system is typically in the form of a computer system operating software or in the form of a "hard-coded" instruction set. This system may be incorporated into a wide variety of devices that provide different functionalities. The second principal aspect is a computer implemented method, typically in the form of software, operated using a data processing system (computer) having one or more processors. The third principal aspect is a computer program product. The computer program product generally represents computer-readable instructions stored on a non-transitory computer-readable medium such as an optical storage device, e.g., a compact disc (CD) or digital versatile disc (DVD), or a magnetic storage device such as a floppy disk or magnetic tape. Other, non-limiting examples of computer-readable media include hard disks, read-only memory (ROM), and flash-type memories. These aspects will be described in more detail below.

A block diagram depicting an example of a system (i.e., computer system 100) of the present invention is provided in FIG. 1. The computer system 100 is configured to perform calculations, processes, operations, and/or functions associated with a program or algorithm. In one aspect, certain processes and steps discussed herein are realized as a series of instructions (e.g., software program) that reside within computer readable memory units and are executed by one or more processors of the computer system 100. When executed, the instructions cause the computer system 100 to perform specific actions and exhibit specific behavior, such as described herein.

The computer system 100 may include an address/data bus 102 that is configured to communicate information. Additionally, one or more data processing units, such as a processor 104 (or processors), are coupled with the address/data bus 102. The processor 104 is configured to process information and instructions. In an aspect, the processor 104 is a microprocessor. Alternatively, the processor 104 may be a different type of processor such as a parallel processor, or a field programmable gate array.

The computer system 100 is configured to utilize one or more data storage units. The computer system 100 may include a volatile memory unit 106 (e.g., random access memory ("RAM"), static RAM, dynamic RAM, etc.) coupled with the address/data bus 102, wherein a volatile memory unit 106 is configured to store information and instructions for the processor 104. The computer system 100 further may include a non-volatile memory unit 108 (e.g., read-only memory ("ROM"), programmable ROM ("PROM"), erasable programmable ROM ("EPROM"), electrically erasable programmable ROM "EEPROM"), flash memory, etc.) coupled with the address/data bus 102, wherein the non-volatile memory unit 108 is configured to store static information and instructions for the processor 104. Alternatively, the computer system 100 may execute instructions retrieved from an online data storage unit such as in "Cloud" computing. In an aspect, the computer system 100 also may include one or more interfaces, such as an interface 110, coupled with the address/data bus 102. The one or more interfaces are configured to enable the computer system 100 to interface with other electronic devices and computer systems. The communication interfaces implemented by the one or more interfaces may include wireline (e.g., serial cables, modems, network adaptors, etc.) and/or wireless (e.g., wireless modems, wireless network adaptors, etc.) communication technology.

In one aspect, the computer system 100 may include an input device 112 coupled with the address/data bus 102, wherein the input device 112 is configured to communicate information and command selections to the processor 100. In accordance with one aspect, the input device 112 is an alphanumeric input device, such as a keyboard, that may include alphanumeric and/or function keys. Alternatively, the input device 112 may be an input device other than an alphanumeric input device. In an aspect, the computer system 100 may include a cursor control device 114 coupled with the address/data bus 102, wherein the cursor control device 114 is configured to communicate user input information and/or command selections to the processor 100. In an aspect, the cursor control device 114 is implemented using a device such as a mouse, a track-ball, a track-pad, an optical tracking device, or a touch screen. The foregoing notwithstanding, in an aspect, the cursor control device 114 is directed and/or activated via input from the input device 112, such as in response to the use of special keys and key sequence commands associated with the input device 112. In an alternative aspect, the cursor control device 114 is configured to be directed or guided by voice commands.

In an aspect, the computer system 100 further may include one or more optional computer usable data storage devices, such as a storage device 116, coupled with the address/data bus 102. The storage device 116 is configured to store information and/or computer executable instructions. In one aspect, the storage device 116 is a storage device such as a magnetic or optical disk drive (e.g., hard disk drive ("HDD"), floppy diskette, compact disk read only memory ("CD-ROM"), digital versatile disk ("DVD")). Pursuant to one aspect, a display device 118 is coupled with the address/data bus 102, wherein the display device 118 is configured to display video and/or graphics. In an aspect, the display device 118 may include a cathode ray tube ("CRT"), liquid crystal display ("LCD"), field emission display ("FED"), plasma display, or any other display device suitable for displaying video and/or graphic images and alphanumeric characters recognizable to a user.

The computer system 100 presented herein is an example computing environment in accordance with an aspect. However, the non-limiting example of the computer system 100 is not strictly limited to being a computer system. For example, an aspect provides that the computer system 100 represents a type of data processing analysis that may be used in accordance with various aspects described herein. Moreover, other computing systems may also be implemented. Indeed, the spirit and scope of the present technology is not limited to any single data processing environment. Thus, in an aspect, one or more operations of various aspects of the present technology are controlled or implemented using computer-executable instructions, such as program modules, being executed by a computer. In one implementation, such program modules include routines, programs, objects, components and/or data structures that are configured to perform particular tasks or implement particular abstract data types. In addition, an aspect provides that one or more aspects of the present technology are implemented by utilizing one or more distributed computing environments, such as where tasks are performed by remote processing devices that are linked through a communications network, or such as where various program modules are located in both local and remote computer-storage media including memory-storage devices.

Figure 2:
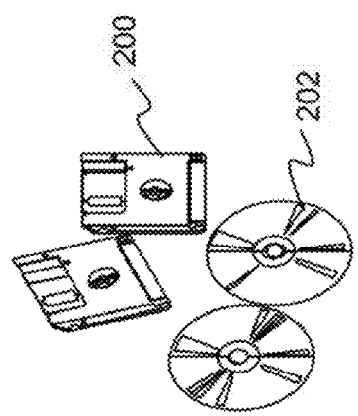
FIG. 2 is an illustration of a computer program product embodying an aspect of the present invention.

An illustrative diagram of a computer program product (i.e., storage device) embodying an aspect of the present invention is depicted in FIG. 2. The computer program product is depicted as floppy disk 200 or an optical disk 202 such as a CD or DVD. However, as mentioned previously, the computer program product generally represents computer-readable instructions stored on any compatible non-transitory computer-readable medium. The term "instructions" as used with respect to this invention generally indicates a set of operations to be performed on a computer, and may represent pieces of a whole program or individual, separable, software modules. Non-limiting examples of "instruction" include computer program code (source or object code) and "hard-coded" electronics (i.e. computer operations coded into a computer chip). The "instruction" is stored on any non-transitory computer-readable medium, such as in the memory of a computer or on a floppy disk, a CD-ROM, and a flash drive. In either event, the instructions are encoded on a non-transitory computer-readable medium.

(2) Introduction

Described is a unique sensing system and architecture for knowledge-enhanced compressive imaging, which is based on the idea of combining context knowledge with signal, task, and online scene knowledge to enhance the representation power of compressive measurement (CM) for specific tasks in the current image environment. The architecture is generally applicable to any type of CM sensing system.

A distinguishing feature of the architecture is the ability to utilize task-related knowledge that is based not only on prior knowledge of the signal and task to be performed, but also on the real-time task-related relationship of the signal to its environment, e.g., its "context." This general framework is applied to the compressive imaging application by adapting CM basis functions or dictionaries and measurement matrices using both task and scene-specific knowledge while filtering out information in the visual scene that is not necessary for the task ("nuisance factors"), thereby focusing representation resources on task-relevant information.

Another distinguishing feature of the architecture is a foveated compressive camera that can perform measurements both globally on the entire scene and in a focused mode on only the regions of interest (ROIs). After initialization of the task-specific dictionary, the camera is used in a global measurement mode to gather scene-specific contextual knowledge and determine the regions of interest (ROIs). The camera is then used in a foveated measurement mode for further adaptation of the representation in order to focus representation resources on task-relevant objects in the ROIs. The camera is then alternately switched between global and local measurements as required to perform an imaging, recognition, or tracking task using a much higher effective resolution due to the adapted representation. Such task-aware sampling will greatly reduce the number of physical measurements needed to achieve a given level of task performance, whether that task is an automated recognition process or goal-driven imaging for a human end-user, thereby greatly increasing the utility of the sensing system while reducing SWAP and communication bandwidth requirements.

The system can be incorporated into a wide range of sensors and imaging systems used, for example, in surveillance, active safety, and factory monitoring. The system can be used to enhance the performance of sensing systems in terms of detection, classification, and tracking. In addition, it is potentially useful for commercial smart camera and intelligent image and video compression applications.

(3) Specific Details of the Invention

The system uses both offline signal/task prior knowledge and real-time signal context or scene knowledge to adapt the CM representation to local regions of interest (ROIs) that are relevant to the task to be performed with the data. The optical architecture is based on a foveated compressive measurement model. In this model, for an input image f of the scene, the compressed measurements y are given by:

$$y = AP_f f + \xi = AP_f D\theta + \xi,$$

where A is the (compressive) measurement CM matrix, the $P_f$ is the ROI operator, D is a dictionary that incorporates prior knowledge of the scene, $\theta$ is the set of (sparse) dictionary coefficients for representing the scene, and $\xi$ represents additive noise. The ROI operator $P_f$ is a diagonal matrix that adapts the measurement matrix A by selecting columns so that only information in the ROIs contributes to the measurements. An upper bound to the number of measurements needed for successful CM reconstruction of an N-pixel image f is given by:

$$M \leq C\mu^2(AP_fD)K\log(N),$$

where $\mu$ is the coherence of the CM matrix and the dictionary D, and K is the sparsity (number of nonzero entries) of the dictionary coefficients $\theta$. In the CM framework the image f can be reconstructed from the measurements by solving an $L_1$-penalized least-squares minimization problem of the form:

$$\hat{\theta} = \arg\min_\theta(\|y - AP_fD\theta\|_2^2 + \alpha\|\theta\|_1),$$

and then reconstructing the image as:

$$\hat{f} = D\hat{\theta}.$$

According to the principles of the present invention, the dictionary and CM matrix are adapted by incorporating signal, task, and scene priors in order to minimize the coherence $\mu$ and sparsity K, and therefore the number of measurements M. Signal priors (such as, for example, the concentration of signal energy of an image in discrete cosine transform (DCT) basis in the coefficients corresponding to lower frequency basis elements) are used to adapt the dictionary to the signal statistics and therefore create a more compact representation, thereby reducing K. Task priors (such as only needing the object label of an image, rather than perfectly recovering all of the image pixel intensities) are used to determine the nuisance factors that can be factored out of the dictionary, also reducing K. Next, the signal and task adapted structure is introduced in the CM matrix by minimizing the coherence $\mu$. Finally, scene priors are used to further adapt the CM matrix in an online-mode by limiting measurements to the task-relevant portions of the scene using the foveation operator $P_f$, which further reduces both $\mu$ and K. The combined exploitation of these multiple types of prior information results in a representation that is both adaptive and highly efficient.

Figure 3:
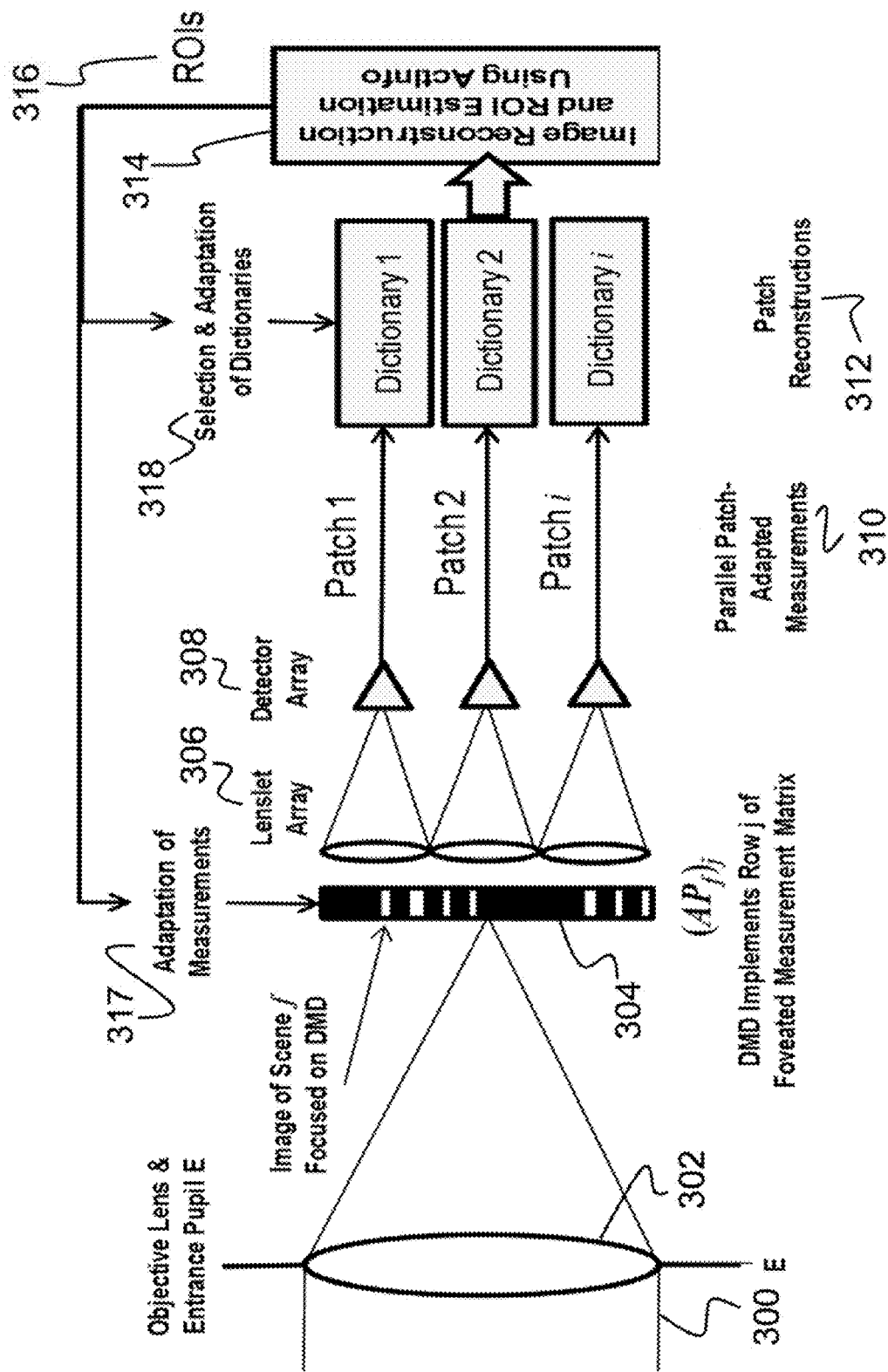
FIG. 3 is an illustration depicting a dual-mode global-local measurement foveated optical compressive measurement architecture according to the principles of the present invention.

For further understanding, FIG. 3 illustrates the optical architecture for the foveated context-aware knowledge-enhanced compressive imaging system. By devoting a larger fraction of the measurement budget to the ROIs, a smaller total number of measurements is required to accomplish the task. This is done by using a dual-mode sensor that functions in both global and local foveated compressive measurement modes. For example, the input scene 300 is focused (via, for example, a lens 302) on a spatial light modulator (SLM) 304 that implements the measurement matrix for CM processing. A Digital Micro-mirror Device (DMD) is depicted as a non-limiting example of an SLM 304 that can be used. This architecture processes image patches in parallel and the rows of the foveated measurement matrix $AP_f$ serially. At each time step j, the product of the input image f and row j of $AP_f$, which is focused on a detector array 308 by the relay lens (e.g., lenslet array 306). Each detector (in the detector array 308) performs a separate patch measurement 310 by spatially integrating $AP_ff$ in its local patch area. All of the k patches are processed in parallel according to the following parallel patch-adapted measurements:

$y_j^i = (AP_f)_j^i f + \xi_j^i$, such that there are a k total number of patches, with the equation referring to the ith patch.

The number of sequential measurements is reduced since the architecture is implementing k single-pixel CM sub-cameras in parallel, where each sub-camera is measuring a small image patch and therefore requires fewer measurements to reconstruct the patch. Patch reconstructions 312 can be accomplished by solving the $L_1$-penalized least-squares minimization problem (as described above) and then reconstructing the image 314 as:

$$\hat{f} = D\hat{\theta}.$$

The optical architecture implements an adaptable compressive measurement camera by converting the reconstruction into a set of k parallel L1 minimization problems. For each measurement cycle, the SLM 304 (e.g., DMD) implements one row of the CM measurement matrix. A cycle consists of measurements 312 and CM reconstruction 314 performed globally over the entire scene followed by foveated measurements that are focused only on the ROIs 316. The foveated measurements and reconstruction are implemented by operating on the measurement matrix with a foveation operator which is calculated using context extracted from the global measurements.

In order to provide for parallelism and to simplify the dictionaries 318, the scene input image 300 is divided into patches which are measured and reconstructed in parallel. The ROIs 316 are estimated online as part of the global CM scene reconstruction. The measurement matrix 317, dictionary 318, and number of measurements are adapted individually for each patch using the ROIs 316. The SLM 304 (e.g., DMD) can also be time-modulated during the measurement integration time in order to process signals that vary in both space and time.

Figure 4:
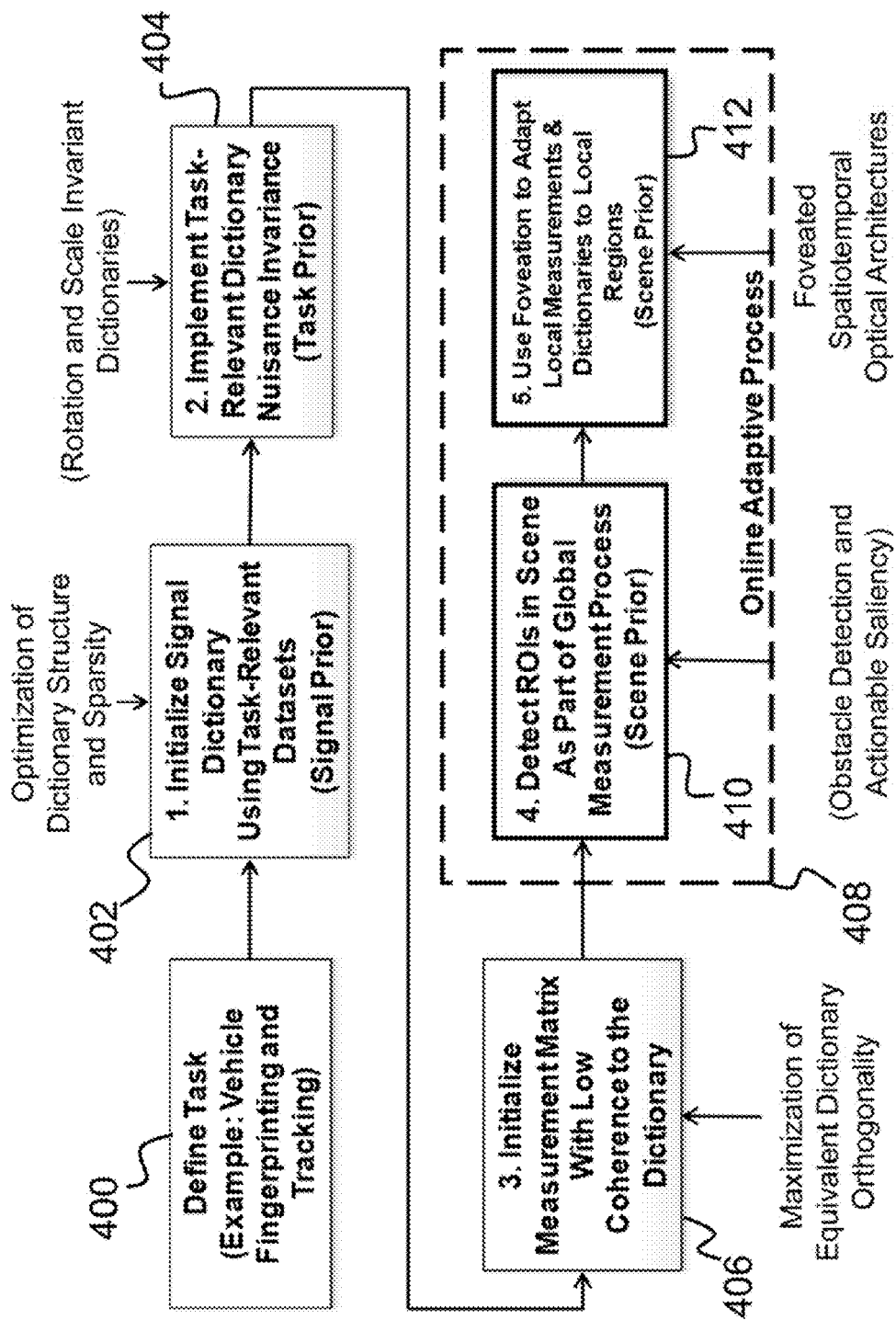
FIG. 4 is a flow chart illustrating a processing pipeline for adaptation of dictionary and measurement matrix to signal, task, and scene knowledge using global and local foveated measurements according to the principles of the present invention.

The processing pipeline for the system is depicted in FIG. 4. The task is first defined 400. For example, knowledge of the task to be performed using CM, such as recognition or object-specific scene enhancement for a human observer, is used to construct and initialize task-specific CM dictionaries and measurement matrices. Specifically, the system initializes 402 a signal dictionary using task-relevant datasets (signal prior). The signal dictionary is, for example, learned from task-relevant datasets using a dictionary learning algorithm, such as the K-SVD method as described by M. Aharon, M. Elad, and A. M. Bruckstein, in "The K-SVD: An Algorithm for Designing of Overcomplete Dictionaries for Sparse Representation", the IEEE Transactions On Signal Processing, Vol. 54, no. 11, pp. 4311-4322, November 2006, which is hereby incorporated by reference as though fully set forth herein.

Thereafter, using rotation and scale invariant dictionaries, the system implements 404 task-relevant dictionary nuisance invariance (task prior). In doing so, the system optimizes 406 the measurement matrix to have minimum mutual coherence to the above learned dictionary using an optimization technique, such as that taught by Lihi Zelnik-Manor, Kevin Rosenblum, Yonina C. Eldar and, "Sensing Matrix Optimization for Block-Sparse Decoding," IEEE Transactions on Signal Processing 59(9): 4300-4312 (2011), which is hereby incorporated by reference as though fully set forth herein.

The dual-mode sensor (through an online adaptive process 408) is then used in a global sensing mode to gather real-time context knowledge (e.g., obstacle detection and actionable saliency) for further adaptation of the basis set and measurement matrix to the signal and its environment. The "dual-mode" refers to reconstructing the different resolutions in different parts of the image (foveation). Further, actionable saliency algorithms can be used to detect salient regions (regions moving differently than the background) to obtain the real-time context knowledge.

Based on the real-time context, the system detects ROIs 410 in the scene as part of the global measurement process. The sensor then switches to ROI-foveated measurement mode 412 with the CM representation adapted to both a priori task knowledge and the current signal context, which enables highly specific and sparse knowledge-based representations. The extraction of context knowledge, which occurs in the global sensing domain, can also be used for active control of the sensor, which is useful for focusing the sensor on the highest likelihood regions of the signal domain and resolving task-irrelevant "nuisances" or distortions for further customization of the representation.

Figure 5:
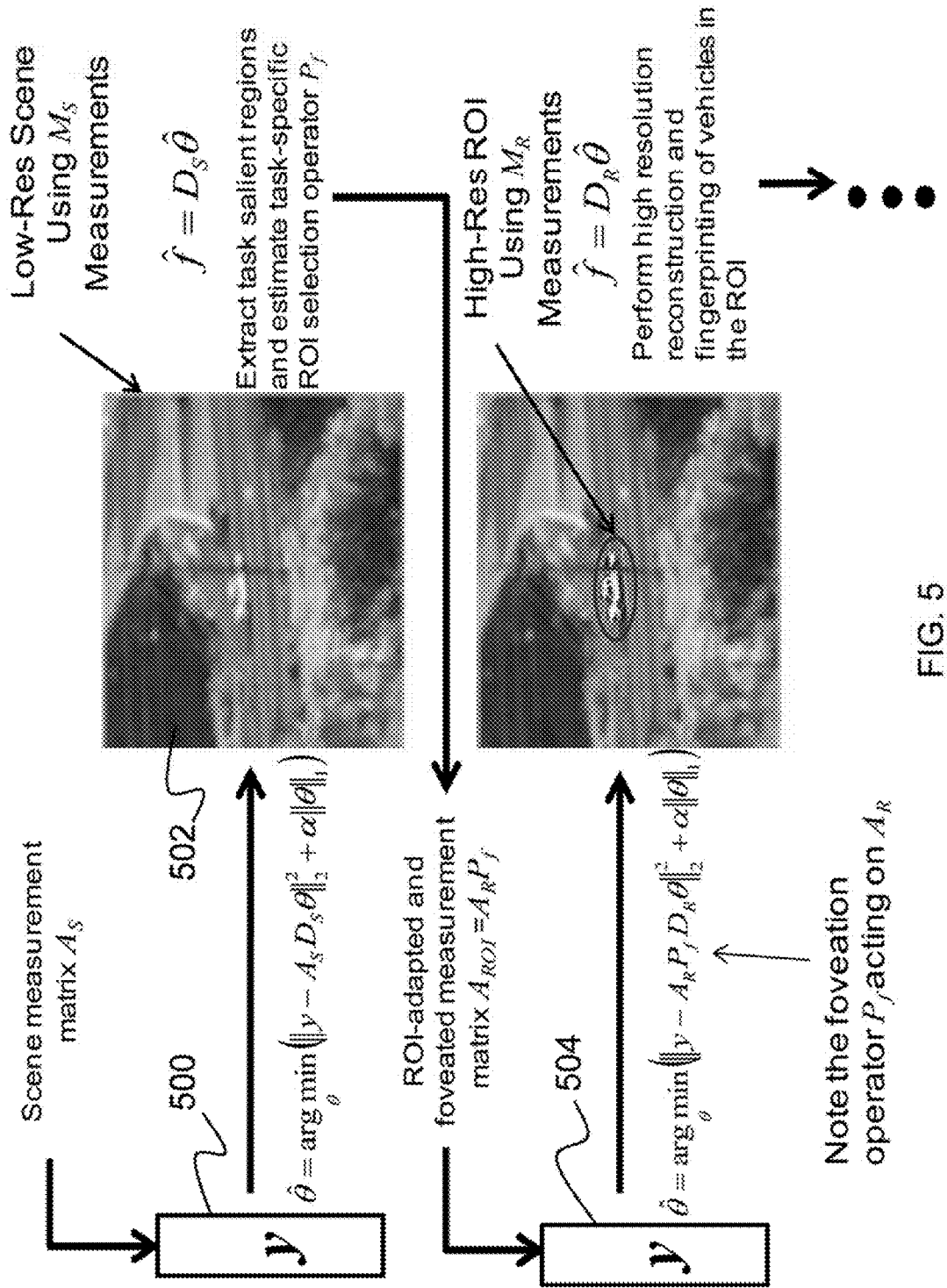
FIG. 5 is an illustration depicting dual-mode global/local measurement and dictionary adaptation to the scene using region of interest (ROI) foveation.

For further understanding, FIG. 5 provides another representation of the online adaptive process in the dashed box of FIG. 4. For example, the dual-mode operation of the foveated optical compressive measurement system is shown in FIG. 5. As shown, the system first performs $M_S$ global measurements y 500 and estimates the scene 502 using nuisance-invariant scene dictionary $D_S$ and scene measurements $A_S$. A non-limiting example of a nuisance-invariant scene dictionary $D_S$ is one generated using a canonization process in which mappings of images to standard configurations are learned from data, while the scene measurements $A_S$ are adapted to the dictionary using methods such as those of Zelnik-Manor et al. as previously cited.

Thereafter, the system extracts task salient regions and estimates a task-specific operator, which are used to generate an ROI-adapted and foveated measurement matrix. The second mode is then employed, which performs $M_R$ local measurements y 504 on task-relevant ROIs using nuisance-invariant adapted signal dictionary $D_R$ and foveated ROI-adapted measurement matrix $A_{ROI}=A_R P_f$. Thereafter, a high-resolution scene can be reconstructed to allow identification of objects in the ROI.

The extraction of contextual knowledge can also be used for active control of the sensor, which is useful for focusing the sensor on the highest likelihood regions of the signal domain and resolving task-irrelevant "nuisances" or distortions for further customization of the representation.

Figure 6:
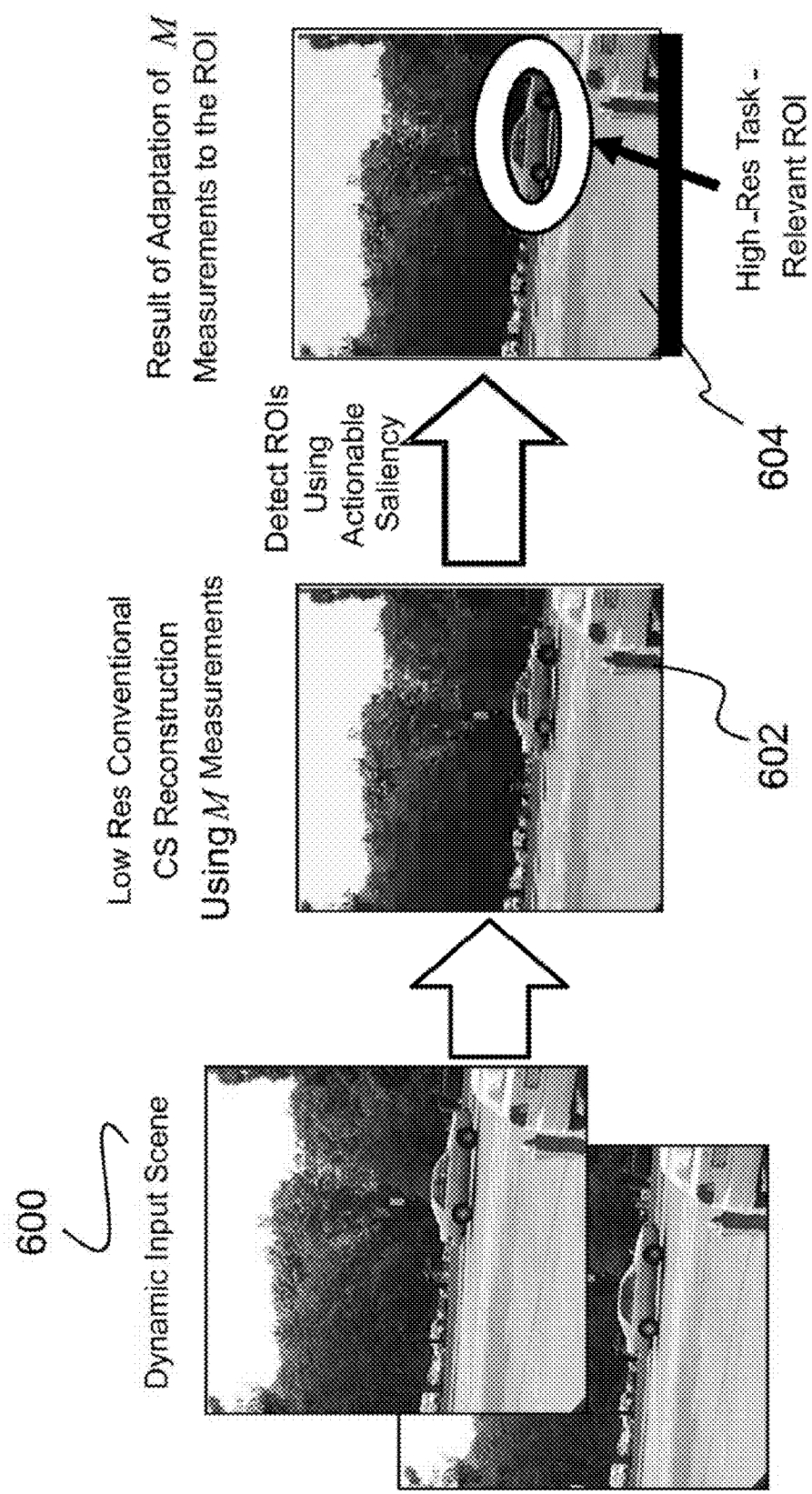
FIG. 6 is a demonstrative example of foveated compressive sensing in which the ROI was cued using actionable saliency to detect object motions and the measurement matrix was adapted to the ROI.

FIG. 6 depicts an example demonstration of foveated compressive sensing in which the ROI was cued using actionable saliency to detect object motions and the measurement matrix was adapted to the ROI. Note the high resolution car CM reconstruction (ROI construction 604) using the same number of measurements as was used to reconstruct the background (background reconstruction 602). In this example, actionable saliency was used to detect ROIs of interest using global measurements, such as objects that are moving differently from other objects or the background. The fixed M measurement budget was then to the ROI, resulting in the composite foveated compressive sensing result (ROI reconstruction 604) shown in FIG. 6, where the high-resolution task relevant ROI is embedded in the lower resolution background. The original image 600 of resolution size 512×512 is 12%-sparse in the Haar wavelet transform domain. The measurement matrix in this experiment was formed from random noiselet measurements, which is less computationally complex than using random Gaussian matrices. The background reconstruction 602, shown in the center, is reconstructed from the 12%-sparse low-resolution image (128×128) using $128^2=16,384$ measurements. On the right is the ROI reconstructed 604 from 6.25% of 512×512 random noiselet measurements, or 16,384 measurements, the same number as for the background reconstruction 602. The ROI reconstruction signal-to-noise ratio (SNR) is 16.3 dB, with respect to the higher resolution 512×512 12%-sparse image. As a reference, the SNR of the background reconstruction 602 restricted to the ROI is 7.19 dB, with respect to the 512×512 12%-sparse image. It should be noted that the terms lower resolution image and higher resolution image are not intended to impart any particular resolution, but to indicate a relative resolution quality as compared between the two images.

FIG. 7A through 7F demonstrates foveated compressed sensing by comparing global CS reconstruction with local CS reconstruction with a fixed budget. In FIG. 7B, for example, the background is shown as being reconstructed globally from 50% measurements of the 64×64 12%-sparse image (as depicted in FIG. 7A). The CM ROI experiment was repeated with various ROI radii, a (depicted in FIGS. 7D, 7E, and 7F), which was reconstructed from 12.5% measurements of the 128×128 12%-sparse image (as depicted as FIG. 7C). Some of the circular ROI CM results are shown in FIGS. 7D, 7E, and 7F, where the ROI radius is equal to 16, 32, and 48, respectively. In these images, the reconstructed ROI is combined with the background reconstruction.

What is claimed is:

1. A system for foveated compressive sensing, the system comprising:
one or more processors and a memory, the memory being a non-transitory computer-readable medium having executable instructions encoded thereon, such that upon execution of the instructions, the one or more processors perform operations of:
receiving an input image f of a scene;
initializing a measurement matrix;
performing global measurements of the input image f;
reconstructing a lower resolution image of the scene;
extracting task salient regions from the low resolution image;
estimating a task-specific operator and detecting regions-of-interest (ROI) based on the task salient regions;
generating an ROI-adapted and foveated measurement matrix;
performing local measurements on task-relevant ROIs; and
reconstructing a higher resolution image of the scene to allow for identification of objects in the ROI.

2. The system as set forth in claim 1, wherein initializing the measurement matrix further includes operations of:
defining a first task;
implementing a task prior; and
initializing the measurement matrix.

3. The system as set forth in claim 2, wherein in initializing a measurement matrix, the input image f is focused on a spatial light modulator (SLM) that processes image patches in parallel and generates rows of a foveated measurement matrix $AP_f$ serially.

4. The system as set forth in claim 3, wherein at each time step j, a product of the input image f and row j of $AP_f$ is focused on a detector array having a plurality of detectors, such that each detector in the detector array performs a separate patch measurement by spatially integrating $AP_f f$ in its local patch area.

5. A computer program product for foveated compressive sensing, the computer program product comprising:
a non-transitory computer-readable medium having executable instructions encoded thereon, such that upon execution of the instructions by one or more processors, the one or more processors perform operations of:
receiving an input image f of a scene;
initializing a measurement matrix;
performing global measurements of the input image f;
reconstructing a lower resolution image of the scene;

extracting task salient regions from the low resolution image;

estimating a task-specific operator and detecting regions-of-interest (ROI) based on the task salient regions;

generating an ROI-adapted and foveated measurement matrix;

performing local measurements on task-relevant ROIs; and reconstructing a higher resolution image of the scene to allow for identification of objects in the ROI.

6. The computer program product as set forth in claim 5, wherein initializing the measurement matrix further includes operations of:

defining a first task;

implementing a task prior, and initializing the measurement matrix.

7. The computer program product as set forth in claim 6, wherein in initializing a measurement matrix, the input image f is focused on a spatial light modulator (SLM) that processes image patches in parallel and generates rows of a foveated measurement matrix $AP_f$ serially.

8. The computer program product as set forth in claim 7, wherein at each time step j, a product of the input image f and row j of $AP_f$, is focused on a detector array having a plurality of detectors, such that each detector in the detector array performs a separate patch measurement by spatially integrating $AP_f f$ in its local patch area.

9. A computer implemented method for foveated compressive sensing, the method comprising an act of:

causing one or more processors to execute instructions encoded on a non-transitory computer-readable medium, such that upon execution, the one or more processors perform operations of:

receiving an input image f of a scene;

initializing a measurement matrix;

performing global measurements of the input image f, reconstructing a lower resolution image of the scene;

extracting task salient regions from the low resolution image;

estimating a task-specific operator and detecting regions-of-interest (ROI) based on the task salient regions;

generating an ROI-adapted and foveated measurement matrix;

performing local measurements on task-relevant ROIs; and reconstructing a higher resolution image of the scene to allow for identification of objects in the ROI.

10. The method as set forth in claim 9, wherein initializing the measurement matrix further includes operations of:

defining a first task;

implementing a task prior; and initializing the measurement matrix.

11. The method as set forth in claim 10, wherein in initializing a measurement matrix, the input image f is focused on a spatial light modulator (SLM) that processes image patches in parallel and generates rows of a foveated measurement matrix $AP_f$ serially.

12. The method as set forth in claim 11, wherein at each time step j, a product of the input image f and row j of $AP_f$, is focused on a detector array having a plurality of detectors, such that each detector in the detector array performs a separate patch measurement by spatially integrating $AP_f f$ in its local patch area.

* * * * *